United States Patent
Fredriks et al.

(10) Patent No.: US 6,799,368 B2
(45) Date of Patent: Oct. 5, 2004

(54) FEEDER DEVICE AND METHOD OF USING SAME

(75) Inventors: Ronald Fredriks, Pine Plains, NY (US); Eric Michael King, Wingdale, NY (US)

(73) Assignee: Zierick Manufacturing Corporation, Mount Kisco, NY (US)

( * ) Notice: Subject to any disclaimer, the term of this patent is extended or adjusted under 35 U.S.C. 154(b) by 0 days.

(21) Appl. No.: 10/128,837

(22) Filed: Apr. 23, 2002

(65) Prior Publication Data

US 2002/0189069 A1 Dec. 19, 2002

Related U.S. Application Data

(60) Provisional application No. 60/285,825, filed on Apr. 23, 2001.

(51) Int. Cl.[7] .................................................. B23Q 7/10

(52) U.S. Cl. .............................. 29/809; 29/837; 29/741; 29/759; 414/412; 414/225.01; 221/22; 221/70

(58) Field of Search .......................... 29/809, 837, 741, 29/740, 743, 759, 564.1, 838, 839; 414/412, 225.01; 221/22, 70; 248/206.5, 68.3

(56) References Cited

U.S. PATENT DOCUMENTS

| | | | | |
|---|---|---|---|---|
| 4,099,324 A | * | 7/1978 | Johnson et al. | 29/739 |
| 4,303,054 A | * | 12/1981 | Lore | 125/11.01 |
| 4,819,326 A | * | 4/1989 | Stannek | 29/837 |
| 4,891,879 A | * | 1/1990 | De Lange | 29/822 |
| 5,605,430 A | * | 2/1997 | Legrady | 414/412 |
| 5,782,445 A | * | 7/1998 | Cleek | 248/206.5 |
| 6,126,376 A | * | 10/2000 | Peterson | 414/403 |
| 6,385,842 B1 | * | 5/2002 | Davis, III | 29/740 |

* cited by examiner

Primary Examiner—David P. Bryant
Assistant Examiner—Stephen Kenny
(74) Attorney, Agent, or Firm—Myron Greerpan, Esq.; Lackenbach Siegel LLP

(57) ABSTRACT

There is provided a feeder device for a pick-and-place machine used to surface mount connectors on printed circuit boards. The feeder is designed for use with matrixes of connectors, such as pin headers. The feeders, with the proper conversion kits, can be configured to feed any type and/or size of the connector. Individual connectors are separated from the matrix by the feeder using a rotating clamping device. Preferably, the feeders are microprocessor controlled, use an edge conveyor to transport the strips to the pick point, and pneumatic cylinders to break each pin header from the strip.

10 Claims, 11 Drawing Sheets

FEEDER DEVICE AND METHOD OF USING SAME

This application claims the benefit of provisional application Ser. No. 60/285,825 filed Apr. 23, 2001.

BACKGROUND OF THE INVENTION

1. Field of the Invention

This invention generally relates to devices and methods for mounting components on printed circuit boards. For specifically, this invention relates to feeder devices for surface mount technology placement machines and methods of using same.

2. Description of the Prior Art

Surface mounting technology ("SMT") is used for creating printed circuits having components that are soldered to the board without using holes. The result is higher component density, allowing for smaller printed circuit boards.

In general, a feeder will supply a component, such as a surface mountable connector, to the pick-up head of a placement machine, which places the component on a printed circuit board (PCB). The components to be feed and placed may be pre-packaged in a variety of formats, including reels and trays. Feeders are typically designed to feed one format of pre-packaged components.

The purpose of the feeders is to handle the pin header strips as an input, and present individual connectors to the placement machine as an output. It is envisioned that the individual pin headers at the output will be picked by nozzles that come down over one or more pins of the header and lift the individual pin headers from the feeder by vacuum.

In general, feeders should be designed to feed the pin headers reliably, quickly, and accurately. The feeders should be as compact as possible, particularly in width, so as not to use any more feeder slots than necessary. They should be able to feed down to the last pin header in the feeder. They should be easy for the operator to load with pin header strips and easy to operate.

Moreover, feeders should be able to be adapted to many placement machines, using as many common parts as possible. The difference from placement machine to placement machine would be the mounting design, the pick point location, and any clearance requirements. The goal would be to make a design that would be able to be adapted as a minimum, to several widely used placement machines, such as Celtronix, Fuji IP/QP, Panasonic MPAV2/MPAG3, Philips Eclipse/GEM, Quad standard mount, Robodyne, Sanyo TIM-1100/1000, Sanyo TCM-V550/V503, Siemens Siplace, and Universal GSM/OFA In addition, feeders should be low maintenance, and be convertible for different length pin headers (2 pin length to 12 pin length) and for either a single or a double row of pins. The conversion process should be able to be performed by a line set up operator, and not require a machine maintenance technician.

SUMMARY OF THE INVENTION

It is an object of the present invention to provide a feeder device for handling matrixes of connectors as an input, and present individual connectors to the placement machine as an output.

It is also an object of the present invention to provide such a feeder device that is reliable, quick, and accurate, as well as compact, easy to load, and easy to operate.

It is a further object of the present invention to provide a feeder device that is adaptable to many placement machines, using as many common parts as possible.

It is yet another object of the present invention to provide a feeder device that is easily and quickly convertible for different length pin headers and for either a single or a double row of pins.

These and other objects of the present invention are accomplished by a feeder device as described herein. A feeder device according to the present invention is designed for use with matrixes of connectors, such as pin headers. The feeders, with the proper conversion kits, can be configured to feed any type and/or size of the connector. Individual connectors are separated from the matrix by the feeder using a rotating clamping device. Preferably, the feeders are microprocessor controlled, use an edge conveyor to transport the strips to the pick point, and pneumatic cylinders to break each pin header from the strip.

BRIEF DESCRIPTION OF THE DRAWINGS

FIG. 5b is a rear view of the clamp of FIG. 4a;

DETAILED DESCRIPTION OF THE INVENTION

Figure 1:
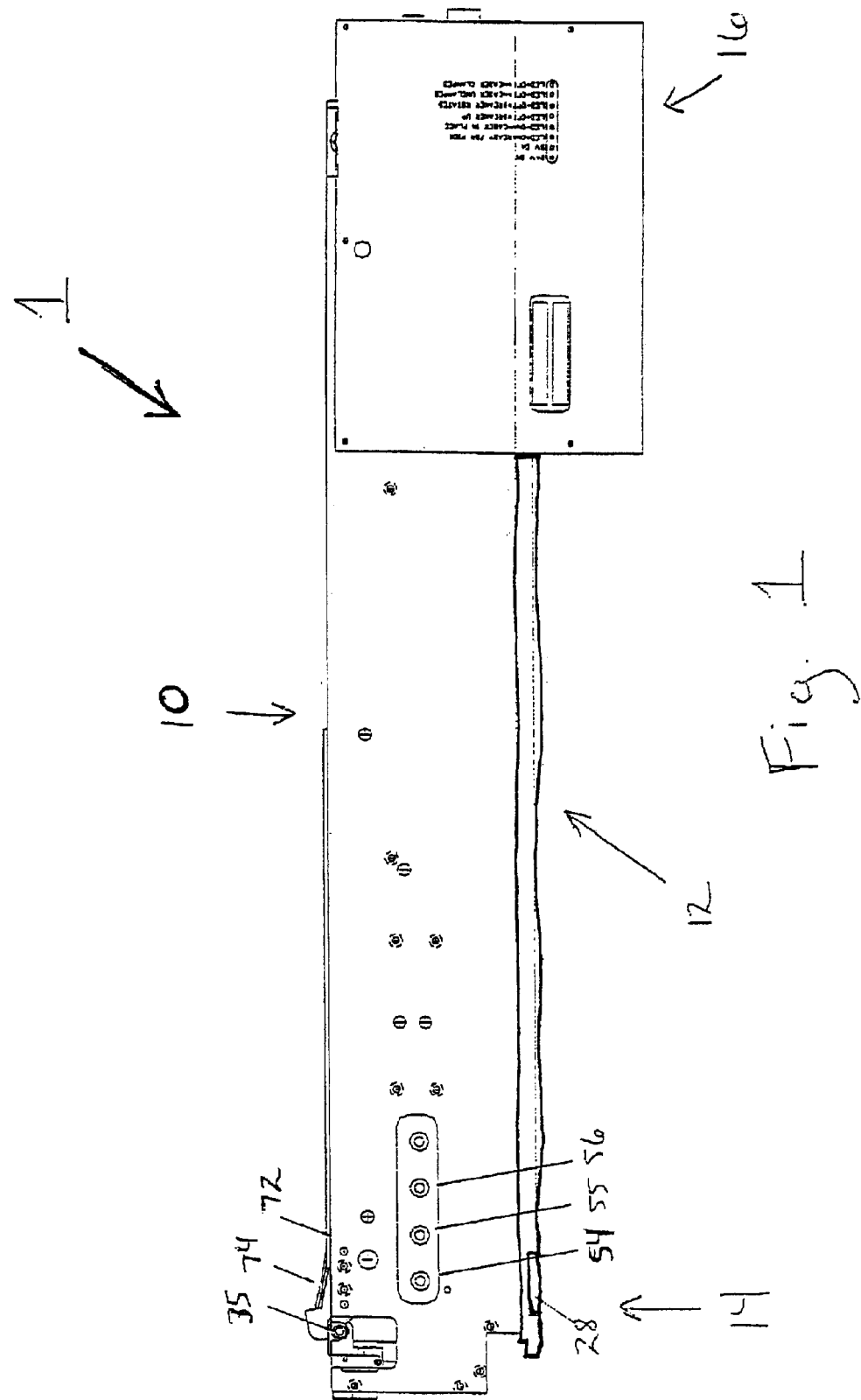
FIG. 1 is a right side plan view of a feeder device according to the present invention.

Referring to the drawings and, in particular, FIG. 1, there is illustrated a feeder device according to the present invention, generally indicated as reference number 1. The feeder is composed of four major sections, the chassis section 12, the breaker section 14, the transport section 10, and the control section 16. In addition, feeder 1 may also be provided with any suitable equipment and accessories, for example, T-slots for mounting accessory hardware. Please note, when referring to the feeder, the left and right sides are as viewed from control section 16. Also, control section 16 is also considered the "rear" of the feeder; the breaker section 14 is at the "front" of feeder device 1.

Figure 2:
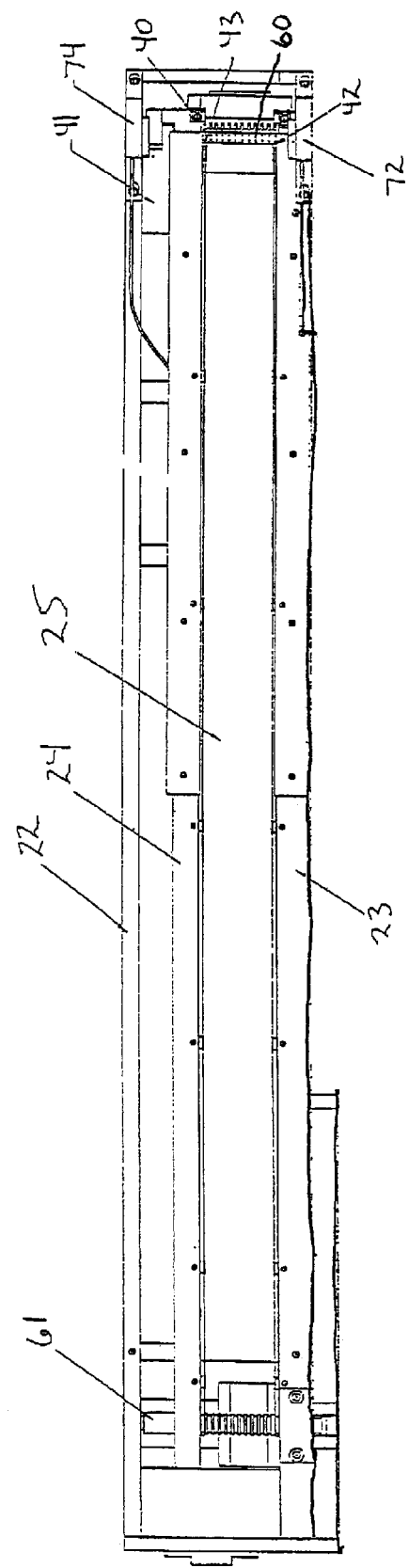
FIG. 2 is a top side plan view of the feeder device of FIG. 1.

Referring to FIG. 2, chassis section 12 has left sidewall 22, right sidewall 23, and movable rail 24. The distance between right sidewall 23 and movable rail 24 defines header width space 25. In addition, chassis section 12 may have a magnetic bar 28 (see FIG. 1) adapted for attachment to a placement machine, as discussed below.

Referring to FIGS. 1 through 4b, breaker section 14 has clamp 35, breaker linkage 36, breaker cylinder 37, clamp cylinder 38, clamp force cylinder 39, header row spacer 40, left breaker support 41, right breaker support 42, movable rail header support 43, clamp pusher bar 44, clamp torsion springs 45, breaker cylinder extend flow control valve 54, breaker cylinder retract flow control valve 55, clamp cylinder retract flow control valve 56, link/breaker connection pin 57, at least one breaker pivot bearing 58, and clamp pressure bar mount 59. Optionally, breaker section 14 may have vacuum cleaning ports 60 adapted to remove dust and other debris from break section 14.

Figure 3:
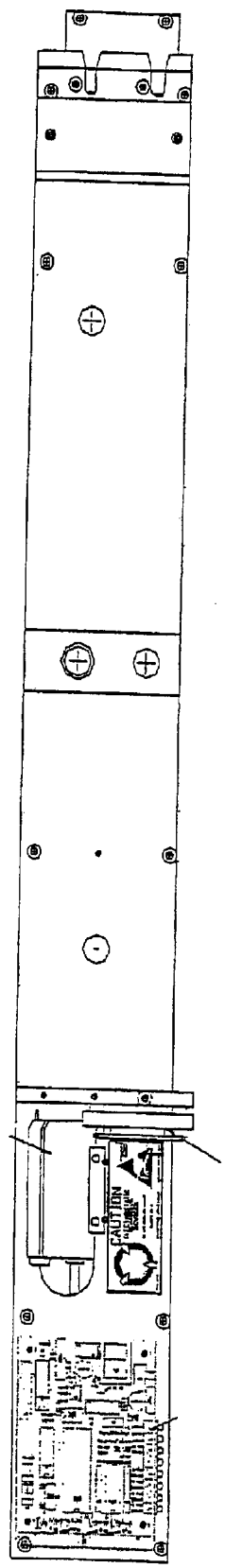
FIG. 3 is a bottom side plan view of the feeder device of FIG. 1.
Figure 4:
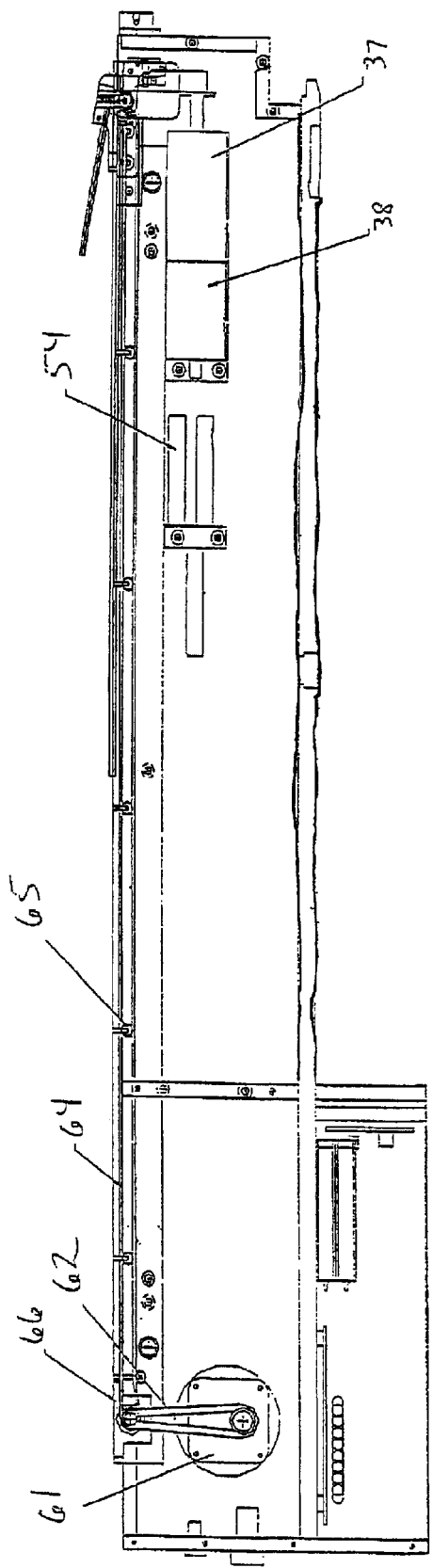
FIG. 4 is a left side plan view of the feeder device of FIG. 1.

Referring in particular to FIG. 3, transport section 10 has drive motor/pulley 61, drive belt 62, conveyor belt drive shaft 63, at least one conveyor belt 64, at least one conveyor belt idler bearing 65, and drive shaft bearing holder 66. Alternatively, transport section 10 may have any suitable means for transporting matrix 80 to break section 14, such as slip-driven rollers. Transport section 10 is preferably relatively quiet, durable, energy efficient, and designed with sealed gears and bearings to resist contamination.

Transport section 10 also preferably has a header-in-place sensor 72 (e.g. a fiber optic), and a placement machine nozzle sensor 74. Sensors 72 and 74 can be compact size photo-electric sensor type, with a sensitivity adjuster, long sensing distance, compatibility with 12–24 V DC operation, NPN and/or PNP outputs, and through beam. Moreover, such sensors can be diffuse reflective, convergent reflective, or narrow view reflective with or without IP67 IEC protection rating.

Preferably, for ease of use, sensors 72 and 74 have two positions, towards the front or towards the rear of feeder 1. The proper position for sensors 72 and 74 for double row headers is towards the front of the feeder. For single row headers, sensors 72 and 74 should be towards the rear. Also for ease of use, sensors 72 and 74 may be protected by appropriate sensor housings. LED indicators can be used to tell whether sensor 72 and 74 are operating correctly. LED indicators can also be used to tell whether sensor 72 and 74 are operating incorrectly, for example, due to soiled fibers, misalignment, damaged fiber, and/or fiber not plugged into amplifier.

Sensors, such as sensors 72 and 74 may be located at any suitable location on or adjacent to the feeder of the present invention. For example, sensors 72 and 74 may be disposed on breaker section 14 or controller section 16.

Control section 16 has control board (not shown). The control board may include any suitable feature, such as an amplifier with automatic response time setting, auto gain setting, sixteen-memory settings, and/or analog output hold. Control section 16 may optionally have an iSAN master bus controller, an eight-channel analog to digital converter, a real-time clock, a keypad, an LCD interface, an infrared remote receiver, an RS232 serial interface, and/or EEPROM program/data storage. Moreover, the control board is preferably programmable to provide simple repetitive sequence signals or complex interactions between the motor and the sensors. Therefore, the preferred control board has a plurality of configurable and/or expandable input and/or outputs, programmable logic controllers, silicon carbide insertion panels, a memory size of seven hundred words CMOS, high speed counting of two kilohertz (kHz) per second, and/or switches and indicators enabling the simulation of input and output events. Also present in control section 16 may be power line protected, fold-back power supplies that are switchable 115/230 V, 50/60 hertz (Hz) operation. A five-digit LED 76 can be employed by control section 16 to display the measurement values or settings of sensors 72 and 74.

Preferably, most of the components in feeder 1 are made from high-performance, static-dissipating materials as defined by MIL B 81705c. In addition, metal surfaces are preferably are provided with at least one nickel plated path to ground.

Feeder device 1 may be converted to feed matrixes of different widths and lengths, as well as pin height.

The width of header row spacer bar 40 depends on whether the header has a single row or a double row. For a single row header, header row spacer 40 is about 0.250" wide, and for a double row header, header row spacer 40 is about 0.180" wide. Header row spacer bar 20 is held to the top of breaker section 14 by two button head screws, located on each side of clamp 35. If the width (i.e., the number of pins) is being changed, header row spacer 40 is changed. In addition, the positions of sensors 72 and 74 are specific for the header row spacer bar 40.

Pin length can range from ¼" to 1". If the pin length is different, then the placement of sensors 72 and 74 are changed.

Figure 6:
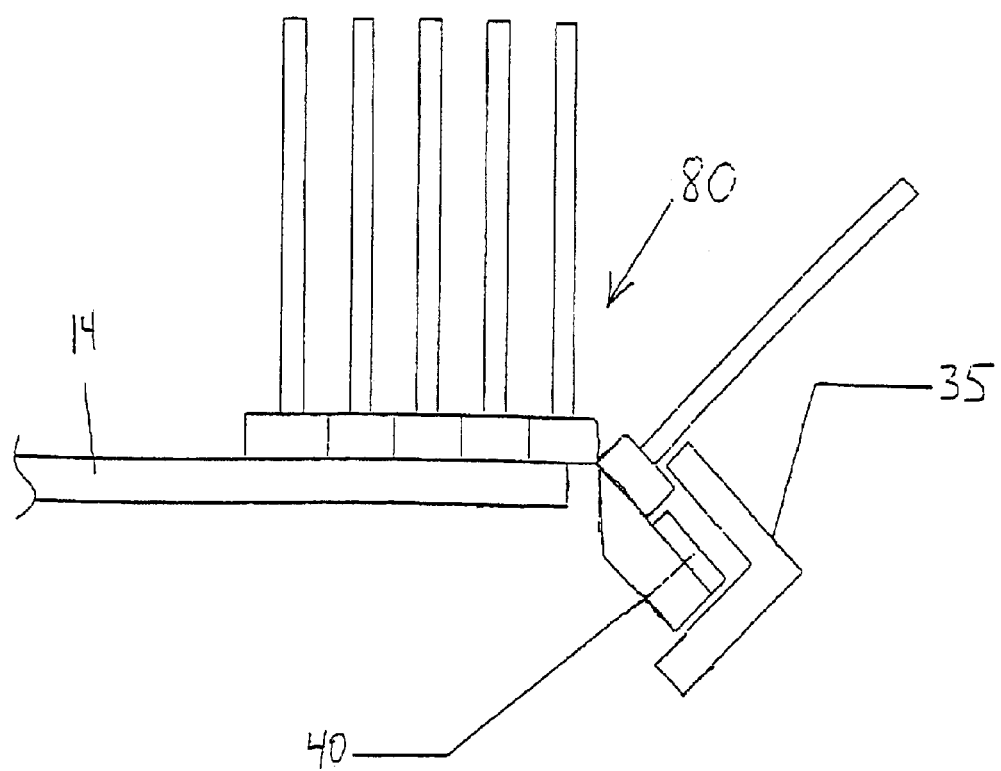
FIG. 6 is a left side plan view of the clamp of FIGS. 4a and 4b during operation thereof.
Figure 7:
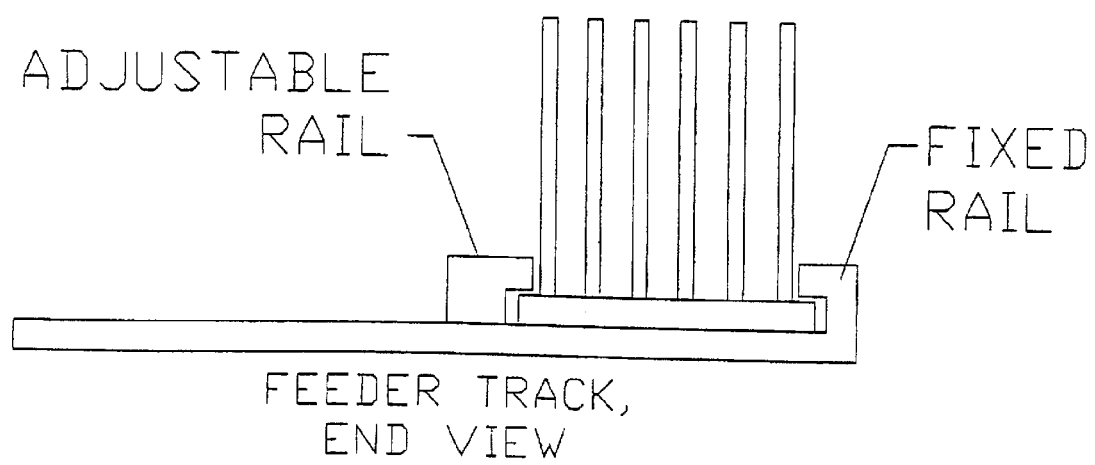
FIG. 7 is a detail plan view of the transport section of the feeder device of FIG. 1 showing a matrix of pin headers being guided thereon.
Figure 8:
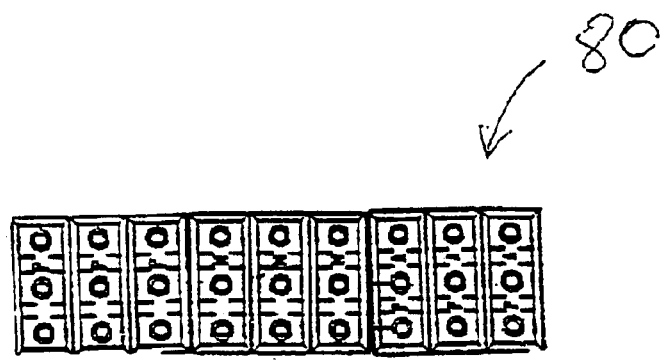
FIG. 8 is a top side plan view of a matrix of pin headers that is preferably fed and separated by the feeder of FIG. 1.
Figure 9:
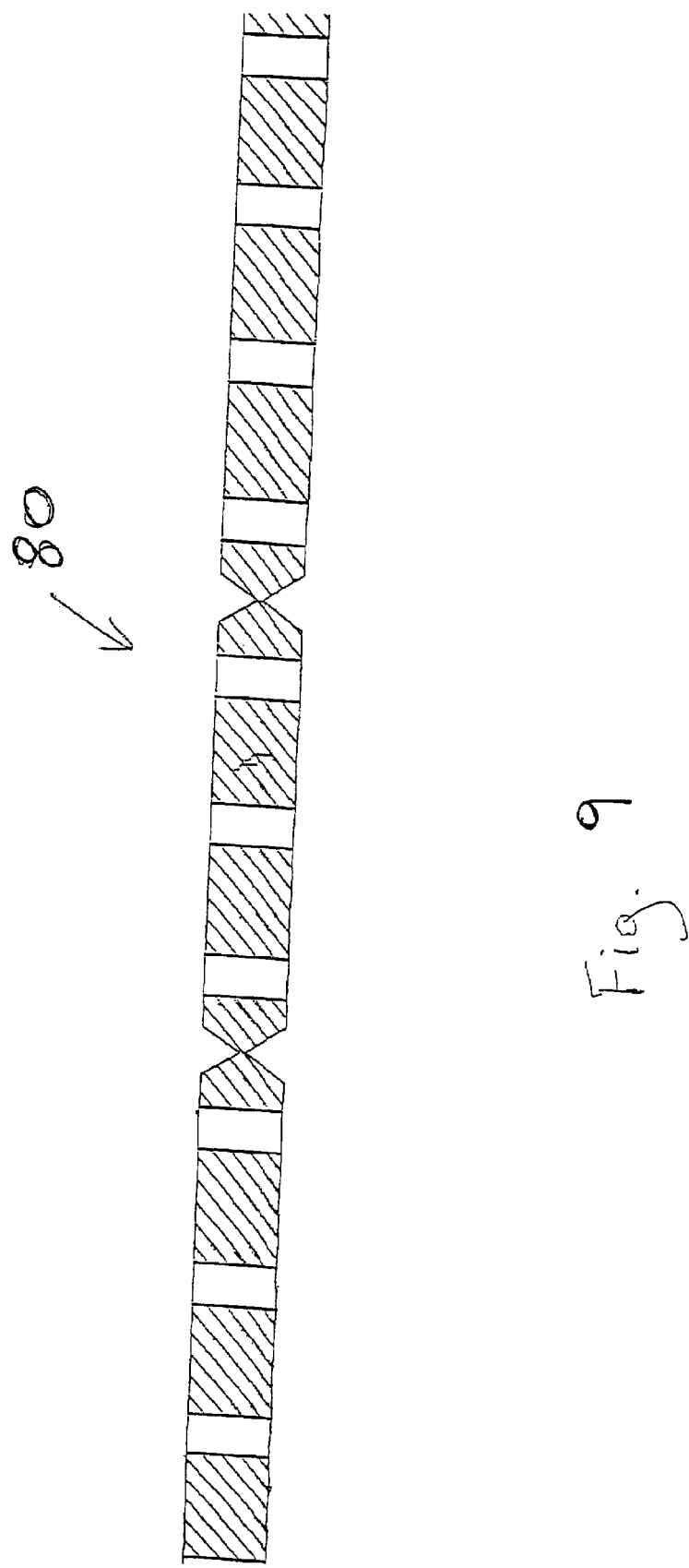
FIG. 9 is a left side plan view of the matrix of FIG. 6 showing the scribe lines therein.
Figure 10:
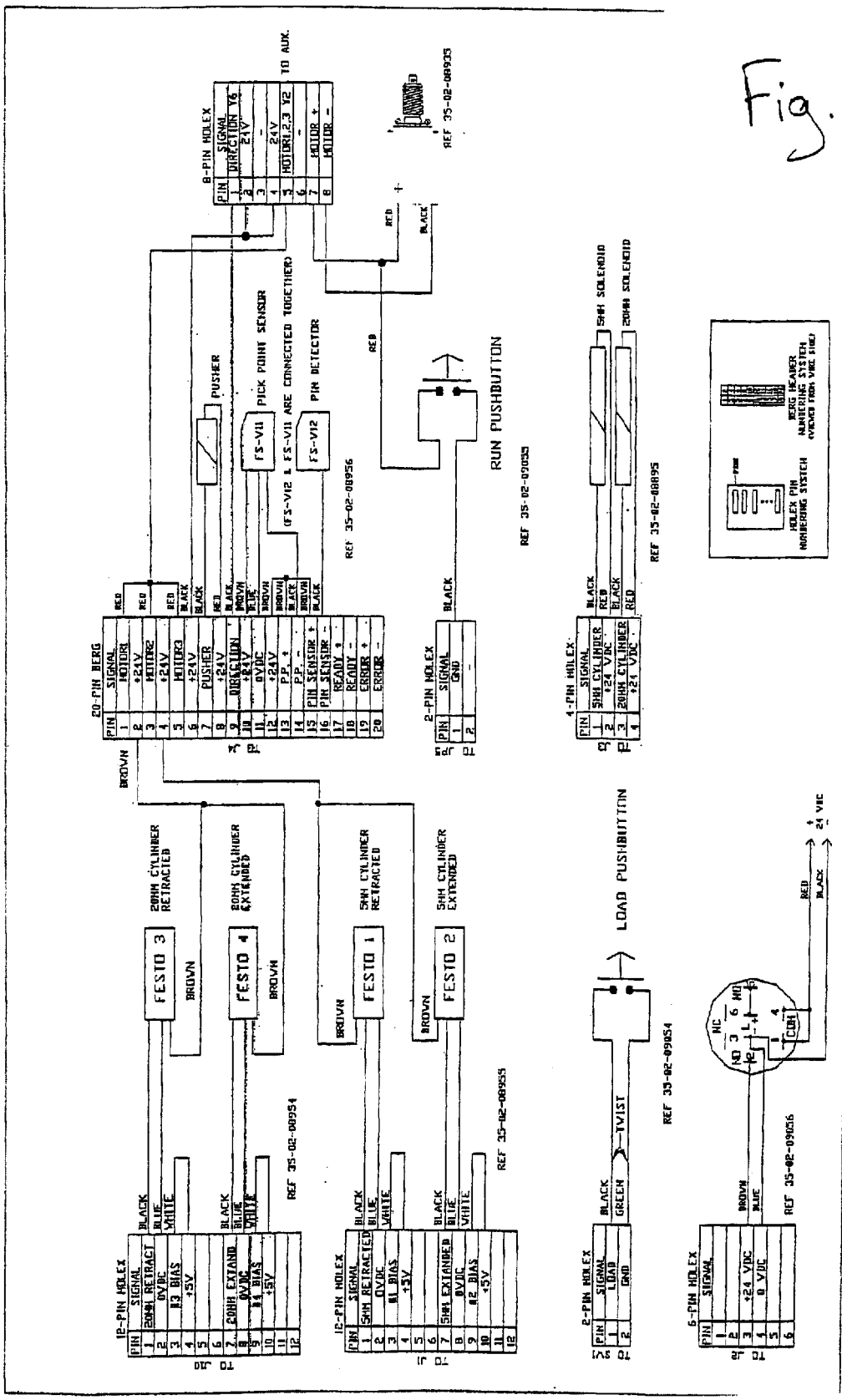
FIG. 10 is a wiring diagram for a feeder device according to the present invention.
Figure 11:
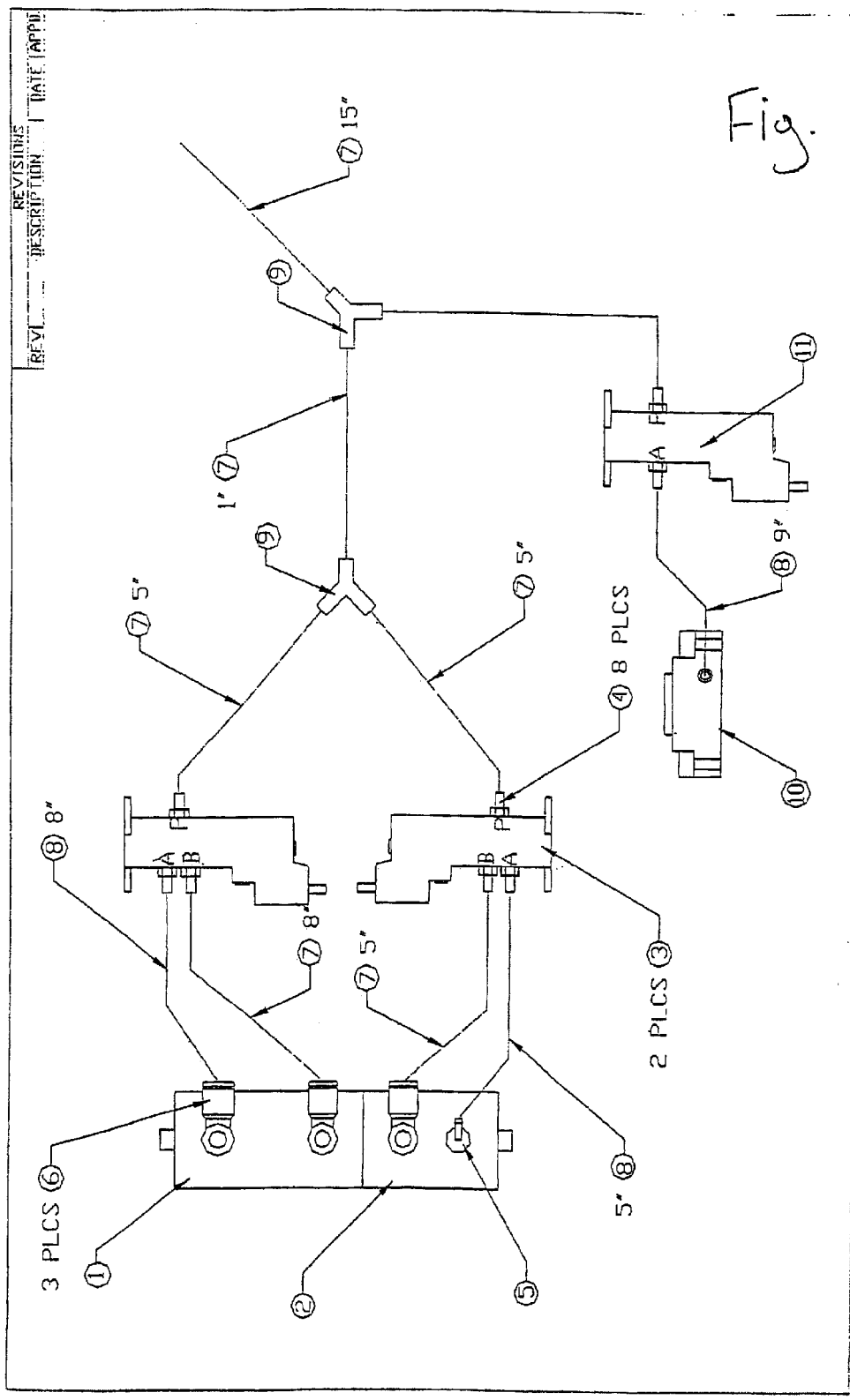
FIG. 11 is a plumbing diagram for a feeder device according to the present invention.

As stated above, feeder 1 may be adapted to feed and break any suitable matrix of connectors. Preferably, feeder 1 is adapted to feed and break a matrix of pin headers for surface mounting on a PCB. Such a preferred matrix of pin headers is described in co-pending U.S. patent application Ser. No. 09/166,632, which is incorporated herein by reference in its entirety. In brief, referring to FIGS. 6 and 7, the preferred matrix of pin headers has a PCB base with square pins. The preferred matrix is provided in a strip form, with individual pin headers having either a single or a double row of pins. Scribe lines in the matrix define the size of the individual pin headers. Preferably, the matrix is scribed on both the top and bottom surfaces thereof. The individual headers are broken from the matrix one at a time and presented to the nozzle of the placement machine to which feeder 1 is associated.

Referring again to FIG. 1, feeder device 1 may be installed on a placement machine using any suitable mounting structure. As stated above, feeder device 1 may have magnetic bar 28. In addition, feeder device 1 may use a latch. Preferably, the mechanical interface with the host machine varies by host machine model. For example, the feeder device may have slots and/or bushings to engage rows of dowel pins, such as those used in placement machines manufactured by Siemens and sold under the trademarks Siplace F4 and F5. As another example, feeder device 1 may have ribs and/or similar structures to engage grooves, such as those used in placement machines manufactured by Fuji and sold under the trademark IP.

To use feeder 1, a matrix 80 is placed on conveyor belt 64 at the rear of feeder 1. Preferably, as long as there is room on conveyor belt 64, a matrix 80 can be loaded thereon at any time during the operation of feeder 1. Once matrix 80 is loaded, conveyor belt 64 transports matrix 80 until the leading edge of matrix 80 contacts header row spacer 40. At that point, the leading row of pins on matrix 80 blocks header-in-place sensor 72. A signal from header-in-place sensor 72 stops conveyor belt 64. Conveyor belt 64 briefly reverses direction to relieve any pushing pressure on matrix 80.

As soon as the leading row of pins on matrix 80 blocks header-in-place sensor 72, clamp cylinder 38 retracts, causing clamp 35 to close on the top of the first pin header.

Clamp 35 is closed by torsion springs 45. The amount of pressure exerted on the first pin header is preferably adjustable by a clamp force cylinder 39.

Figure 5B:
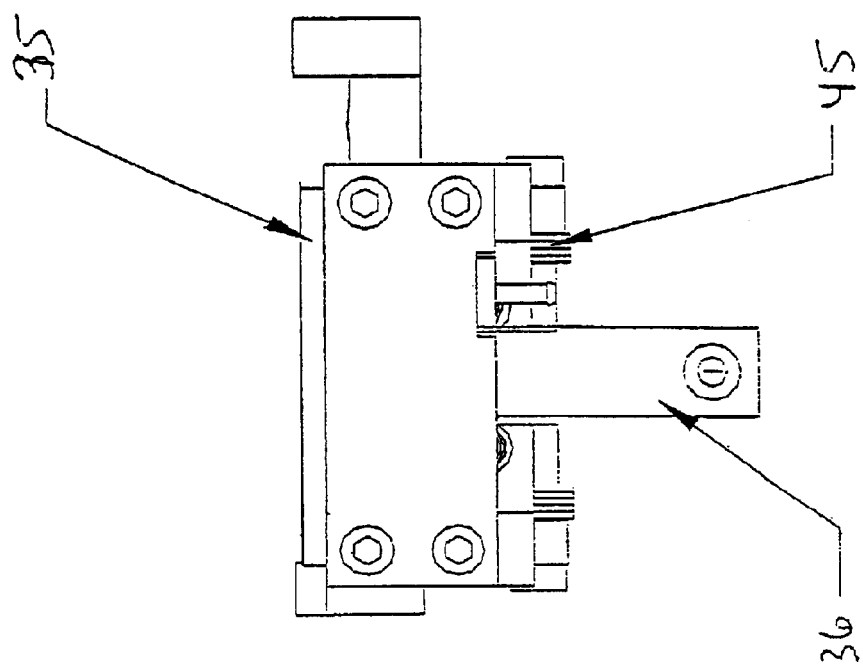
Figure 5A:
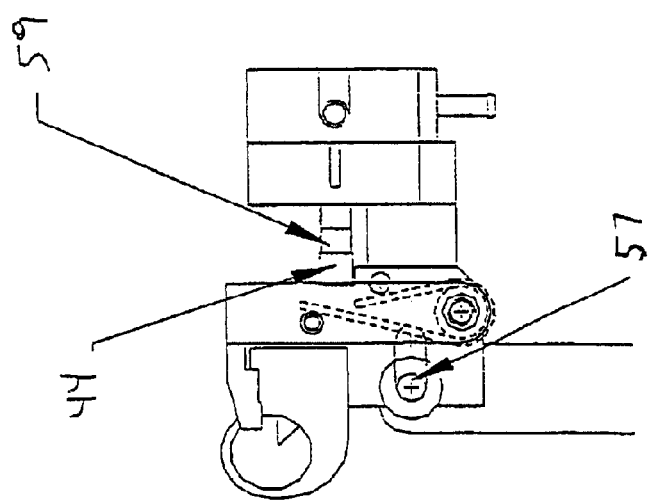
FIG. 5a is a left side detail plan view of a clamp for use in the feeder device of FIG. 1.

Referring to FIG. 5, once clamp 35 is closed on the first pin header, clamp 35 and breaker cylinder 37 retract. Since clamp 35 is connected to breaker cylinder 37 by a breaker linkage 36, the resulting action is that clamp 35 rotates around breaker pivot bearing 58. The lead pin header also rotates, since it is closed within clamp 35, and breaks free from the rest of matrix 80. The "snap" action of breaker section 16 needs to be fairly fast, but the impact at the end of stroke should not be violent. Alternatively, once the lead pin header is broken from matrix 80, the freed pin header can be dropped and/or raised relative to matrix 80, for example, about 0.1 inch, in order to ensure that the freed pin header is completely separated from matrix 80. Preferably, feeder device 1 has an appropriate flow controller or controllers to adjust the speed of the operation of breaker section 16. As soon as retraction of breaker cylinder 37 is detected by breaker cylinder retract sensor 51, clamp cylinder 38 extends, which returns the freed pin header to a substantially level position. The freed pin header is held in place by the force of clamp torsion springs 25 and/or by vacuum clamping ports (not shown). Clamp force cylinder 39 retracts and feeder 1 waits for the placement machine to come and pick the freed pin header. At any time during this operation, optionally provided vacuum cleaning ports may be employed to remove dust and other debris from break section 14.

The nozzle of the placement machine blocks the placement machine nozzle sensor 74 when it approaches the top if the freed pin header. When this happens, clamp cylinder 38 extends, unclamping the pin header, so that the freed pin header can be removed by the nozzle. Optionally, when vacuum clamping ports are used to hold the freed pin header, the vacuum ports are pressurized to agitate the pin header from its close proximity to the matrix 80 and also to move the freed pin header into the nozzle of the placement machine.

As soon as both placement machine nozzle sensor 74 and header-in-place sensor 72 are unblocked, conveyor belt 64 is driven and the next pin header in matrix 80 is stopped against header row spacer 40.

The feeder's ease of loading, along with its large capacity, decreases the amount of time spent on refills and results in smoother operation interactions with the machines. The feeder's narrow design provides high feeder density to the host machine.

The foregoing represents a description of a preferred embodiment of the present invention. Variations and modifications of the embodiments described and shown herein will be apparent to persons skilled in the art, without departing from the inventive concepts disclosed herein.

Wherefore we claim:

1. A feeder device for a pick-and-place machine comprising:
   a breaker having a rotatable clamping section;
   a transporter having a transporting surface adapted to deliver a board of integrally connected contact headers to said rotatable clamping section, said board of contact headers having weakened points between adjacent contact headers at which an individual contact header may be separated from said board of contact headers by said rotatable clamping section of said breaker; and
   a controller that regulates the operation of said transporter and said breaker.

2. The feeder device of claim 1, further comprising a chassis attached to the pick-and-place machine.

3. The feeder device of claim 2, wherein the chassis is attached to the pick-and-place machine by at least one magnet.

4. The feeder device of claim 1, wherein the transporting surface is a conveyor belt.

5. The feeder device of claim 1, wherein the rotatable clamping section comprises a clamp rotatable about a clamp pivot and operably connected to a retractable cylinder, wherein retraction of the retractable cylinder causes the clamp to rotate about the clamp pivot.

6. The feeder device of claim 1, wherein the breaker is adapted to move vertically relative to the transporter.

7. The feeder device of claim 1, wherein the transporter comprises at least one header-in-place sensor to determine the position of the leading edge of the board of contact headers.

8. The feeder device of claim 1, wherein the transporter comprises a placement machine nozzle sensor to detect when a placement machine nozzle is approaching the breaker.

9. The feeder device of claim 1, wherein the transporter and the breaker are convertible to feed and break boards of contact headers having different widths, lengths, and contact heights.

10. A feeder device for a pick-and-place machine comprising:
    a breaker having a rotatable clamping section;
    a transporter having a transporting surface adapted to deliver a board of contact headers to said rotatable clamping section, said board of contact headers having a weakened point at which an individual contact header may be separated from said board of contact headers; and
    a controller that regulates the operation of said transporter and said breaker,
    wherein said breaker comprises vacuum cleaning ports adapted to remove dust and other debris from the breaker.

* * * * *